(12) United States Patent
Yonehara et al.

(10) Patent No.: US 11,037,415 B2
(45) Date of Patent: Jun. 15, 2021

(54) TACTILE PRESENTATION DEVICE

(71) Applicant: TOYODA GOSEI CO., LTD., Kiyosu (JP)

(72) Inventors: Yuji Yonehara, Kiyosu (JP); Masatoshi Shimada, Kiyosu (JP); Takeshi Fujiwara, Kiyosu (JP)

(73) Assignee: TOYODA GOSEI CO., LTD., Aichi-pref. (JP)

( * ) Notice: Subject to any disclaimer, the term of this patent is extended or adjusted under 35 U.S.C. 154(b) by 0 days.

(21) Appl. No.: 16/955,378

(22) PCT Filed: Dec. 25, 2018

(86) PCT No.: PCT/JP2018/047586
§ 371 (c)(1),
(2) Date: Jun. 18, 2020

(87) PCT Pub. No.: WO2019/142619
PCT Pub. Date: Jul. 25, 2019

(65) Prior Publication Data
US 2021/0020003 A1    Jan. 21, 2021

(30) Foreign Application Priority Data

Jan. 19, 2018  (JP) .............................. JP2018-007259

(51) Int. Cl.
*H04B 3/36*   (2006.01)
*G08B 6/00*   (2006.01)
(Continued)

(52) U.S. Cl.
CPC .............. *G08B 6/00* (2013.01); *G06F 3/014* (2013.01); *G06F 3/016* (2013.01); *H01L 41/042* (2013.01);
(Continued)

(58) Field of Classification Search
CPC ........... G08B 6/00; G06F 3/014; G06F 3/016; H01L 41/042; H01L 41/0986; H01L 41/193
See application file for complete search history.

(56) References Cited

U.S. PATENT DOCUMENTS 8,570,163 B2 * 10/2013 Makinen .............. G09B 21/003
340/407.2
2003/0016207 A1    1/2003 Tremblay et al.
(Continued)

FOREIGN PATENT DOCUMENTS

JP   2010-003312 A   1/2010
JP   2012-065426 A   3/2012
(Continued)

OTHER PUBLICATIONS

International Search Report of the International Searching Authority dated Mar. 12, 2019 for the corresponding international application No. PCT/JP2018/047586(and English translation).

*Primary Examiner* — Toan N Pham
(74) *Attorney, Agent, or Firm* — Posz Law Group, PLC

(57) ABSTRACT

A tactile presentation device is provided with: a glove worn on the hand of a user; polymer actuators attached to a base fabric of the glove; a control device which controls the polymer actuators; and an array of haptic stimulators driven by the polymer actuators. The tactile presentation device drives the haptic stimulators using the polymer actuators through the application of a voltage to the polymer actuators by means of the control device, and performs tactile presentation to the skin of the hand of the user by driving the haptic stimulators. The polymer actuators are capable of causing the haptic stimulators to be displaced by at least 100 μm when the frequency of the applied voltage is 1 to 30 Hz and more preferably 1 to 100 Hz.

10 Claims, 2 Drawing Sheets

(51) Int. Cl.
  *G06F 3/01* (2006.01)
  *H01L 41/04* (2006.01)
  *H01L 41/09* (2006.01)
  *H01L 41/193* (2006.01)
(52) U.S. Cl.
  CPC ........ *H01L 41/0986* (2013.01); *H01L 41/193* (2013.01)

(56) References Cited

U.S. PATENT DOCUMENTS

| | | |
|---|---|---|
| 2004/0046777 A1 | 3/2004 | Tremblay et al. |
| 2007/0030246 A1 | 2/2007 | Tremblay et al. |
| 2008/0055248 A1 | 3/2008 | Tremblay et al. |
| 2008/0059138 A1 | 3/2008 | Tremblay et al. |
| 2009/0225046 A1 | 9/2009 | Kim et al. |
| 2011/0018697 A1 | 1/2011 | Birnbaum |
| 2011/0021272 A1 | 1/2011 | Grant et al. |
| 2012/0060355 A1 | 3/2012 | Tsuchikawa et al. |
| 2013/0328814 A1 | 12/2013 | Birnbaum |
| 2014/0009273 A1 | 1/2014 | Grant et al. |
| 2014/0337724 A1 | 11/2014 | Tremblay et al. |
| 2015/0339899 A1* | 11/2015 | Ozaki ............ G06F 3/0416 340/407.1 |
| 2016/0231814 A1 | 8/2016 | Grant et al. |
| 2017/0168573 A1 | 6/2017 | Birnbaum |
| 2017/0357323 A1 | 12/2017 | Grant et al. |
| 2019/0073037 A1 | 3/2019 | Grant et al. |

FOREIGN PATENT DOCUMENTS

| | | |
|---|---|---|
| JP | 4955618 B2 | 6/2012 |
| JP | 2014-220949 A | 11/2014 |
| JP | 2016-024707 A | 2/2016 |
| JP | 2017-201533 A | 11/2017 |

* cited by examiner

TACTILE PRESENTATION DEVICE

CROSS REFERENCE TO RELATED APPLICATIONS

This application is a U.S. national stage application of International Patent Application No. PCT/JP2018/047586 filed on Dec. 25, 2018, which claims priority to Japanese Patent Application No. 2018-007259 filed on Jan. 19, 2018 the contents of which are incorporated herein by reference.

BACKGROUND

The present invention relates to a tactile presentation device.

Patent Document 1 discloses a tactile presentation device that presents a tactile sensation to a skin. The tactile presentation device includes a contact portion configured to contact the skin. When the contact portion is driven to physically stimulate the skin, skin sensory receptors (reception cells) give the user a simulated tactile sensation, with which the user feels something touching him/her, or a simulated pressure sensation, with which the user feels something pressed against him/her.

The tactile presentation device disclosed in Patent Document 1 includes an eccentric motor that drives the contact portion. The eccentric motor vibrates the contact portion to physically stimulate the skin with which the contact portion is in contact. Patent Documents 2 and 3 disclose a tactile presentation device including a piezoelectric element and a polymer actuator that drive a contact portion. When voltage having a predetermined frequency is applied to the piezoelectric element and the polymer actuator, the contact portion vibrates. This allows the skin with which the contact portion is in contact to be physically stimulated.

Known skin sensory receptors include Ruffini ending and Pacinian corpuscle, which are located at relatively deep positions of the skin, and Merkel cell and Meissner's corpuscle, which are located at relatively shallow positions of the skin. These sensory receptors react differently to physical stimulus in terms of frequencies and displacement amounts (amplitudes) of the vibration of the contact portion.

In FIG. 5, solid line L1, broken line L2, alternate long and short dashed line L3, and long dashed double-short dashed line L4 respectively indicate the minimum values of the amplitudes of the contact portion (i.e., physical stimulus) relative to changes in the frequency of the vibration of the contact portion at which Merkel cell (L1), Meissner's corpuscle (L2), Ruffini ending (L3), and Pacinian corpuscle (L4) may react.

As shown in FIG. 5, regarding Ruffini ending (L3) and Pacinian corpuscle (L4), which are deep in the skin, the minimum values of the changes in the minimum values of the amplitudes of the vibration at which they may react are relatively small. Regarding Merkel cell (L1) and Meissner's corpuscle (L2), which are not deep in the skin, the minimum values in the changes of the minimum amplitudes of the vibration at which they may react are relatively large. To ensure the diversity of a tactile sensation presented to the skin, it is desired that the tactile presentation device provide a physical stimulus (vibration) to which various sensory receptors, especially the sensory receptors at relatively shallow positions of the skin (such as Merkel cell and Meissner's corpuscle), may react.

PRIOR ART DOCUMENTS

Patent Documents

Patent Document 1: Japanese Laid-Open Patent Publication No. 2010-3312
Patent Document 2: Japanese Laid-Open Patent Publication No. 2017-201533
Patent Document 3: Japanese Patent No. 4955618

SUMMARY

However, Patent Documents 2 and 3 do not disclose specific structures of the piezoelectric element and the polymer actuator. Thus, it is unknown whether the piezoelectric element and the polymer actuator can be used to vibrate the contact portion such that the sensory receptors (for example, Merkel cell and Meissner's corpuscle) may react. Further, the eccentric motor described in Patent Document 1 is large and heavy. Thus, the weight of the eccentric motor affects the vibration of the contact portion. This makes it difficult to vibrate the contact portion so as to provide an aimed tactile sensation through the sensory receptors such as Merkel cell and Meissner's corpuscle.

It is an objective of the present invention to provide a tactile presentation device capable of providing a physical stimulus to which skin sensory receptors at relatively shallow positions of the skin, such as Merkel cell and Meissner's corpuscle, may react.

Means and advantages for solving the above-described problem will now be described.

According to an aspect of the present invention, a tactile presentation device includes a contact portion configured to contact a skin, a polymer actuator that drives the contact portion, and a controller that applies voltage to the polymer actuator. The tactile presentation device is configured to present a tactile sensation to the skin by driving the contact portion using the polymer actuator through the application of the voltage to the polymer actuator by the controller. The polymer actuator is configured to displace the contact portion by at least 100 μm when a frequency of the voltage to be applied is 1 to 30 Hz.

In this structure, when the voltage of the frequency of 1 to 30 Hz is applied to the polymer actuator, the contact portion is driven by the polymer actuator to apply vibration to the skin as a physical stimulus having the frequency of as low as 1 to 30 Hz and the amplitude (displacement amount) of at least 100 μm. Thus, the vibration (physical stimulus) to which the sensory receptors such as Merkel cell and Meissner's corpuscle in the skin may react can be applied to them using the contact portion. Since the polymer actuator is small and lightweight, the tactile presentation device can be reduced in size and weight. This also enables to limit the influence of the weight of the polymer actuator on the vibration of the contact portion.

It is preferred that the polymer actuator be configured to displace the contact portion by at least 100 μm when the frequency of the voltage to be applied is 1 to 100 Hz.

The controller may be capable of applying, to the polymer actuator, voltage of at least 1200 V at the frequency of 1 to 30 Hz.

In the tactile presentation device, the polymer actuator may expand and contract in a direction orthogonal to the skin to drive the contact portion so as to displace the contact portion in the direction orthogonal to the skin.

In this structure, the contact portion driven by the polymer actuator is displaced in the direction that is orthogonal to the skin. Thus, the vibration (displacement) of the contact portion through the driving of the polymer actuator can be easily applied to the skin as a physical stimulus.

The polymer actuator may include a laminate of a dielectric elastomer layer and conductive rubber layers, the conductive rubber layers being arranged on opposite surfaces of the dielectric elastomer layer such that the dielectric elastomer layer and the conductive rubber layers are positioned in an alternating manner in a thickness direction. The polymer actuator may be configured to expand and contract the dielectric elastomer layer in the thickness direction through the application of the voltage to the conductive rubber layers.

In this structure, the dielectric elastomer layer and the conductive rubber layers are formed to be thin. Accordingly, even if the dielectric elastomer layer and the conductive rubber layers are laminated in an alternating manner in the thickness direction, the polymer actuator will not be too large. This allows the user to wear and use the tactile presentation device.

A length of the polymer actuator in the thickness direction may be 5 cm or less and is preferably 3 cm or less.

To reduce the device in size and weight, it is preferred that the dielectric elastomer layer be made of a crosslinked polyrotaxane having a lower permittivity than other elastomers.

The tactile presentation device may further include a flexible base material attachable to a human body so as to be in contact with the skin. The contact portion may be supported by the polymer actuator on a surface of the base material opposite to a surface of the base material that is in contact with the skin. The base material may include a hole and the contact portion may include a shaft extending through the hole of the base material so that the shaft contacts the skin.

The polymer actuator may include a hole communicating with the hole of the base material. The shaft of the contact portion may extend through the hole of the base material and the hole of the polymer actuator.

The present invention can provide a physical stimulus to which skin sensory receptors at relatively shallow positions of the skin, such as Merkel cell and Meissner's corpuscle, may react.

DETAILED DESCRIPTION OF THE PREFERRED EMBODIMENTS

A tactile presentation device according to an embodiment will now be described with reference to FIGS. 1 to 5.

Figure 1:
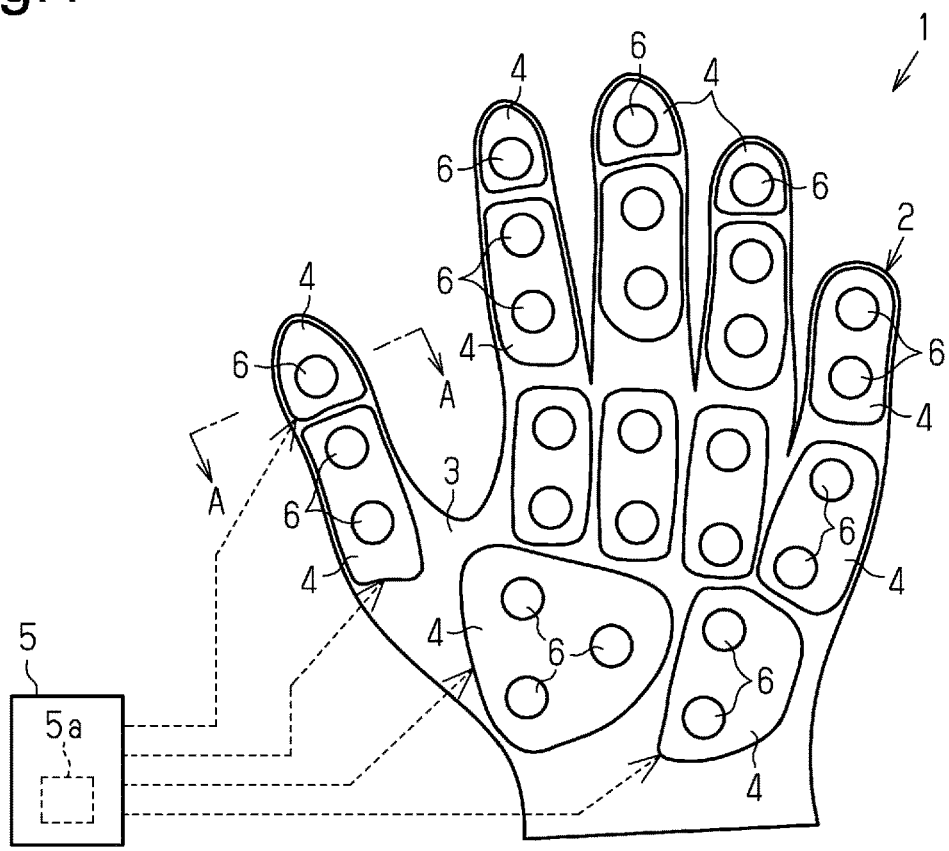
FIG. 1 is a schematic diagram showing the entirety of a tactile presentation device.

FIG. 1 shows a tactile presentation device 1 that includes a glove 2, polymer actuators 4, a controller 5, and an array of haptic stimulators 6. The glove 2 is worn on the hand of a user (human body). The polymer actuators 4 are attached to a base fabric 3 of the glove 2. The controller 5 controls the polymer actuators 4. The haptic stimulators 6 are driven by the polymer actuators 4. The base fabric 3 of the glove 2 is made of a flexible material. The base fabric 3 serves as a base material attached to the human body so as to be in contact with the skin of the hand of the user. The tactile presentation device 1 drives the array of the haptic stimulators 6 using the polymer actuators 4 through the application of voltage to the polymer actuators 4 by the controller 5. By driving the array of the haptic stimulators 6, the tactile presentation device 1 presents a tactile sensation to the skin of the hand of the user.

Figure 2A:
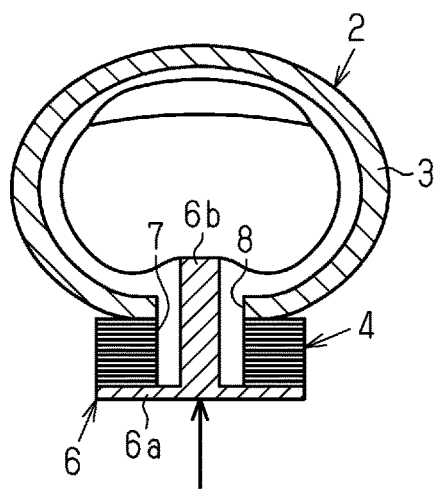
FIGS. 2A and 2B are cross-sectional views of the glove taken along arrow A-A shown in FIG. 1.
Figure 2B:
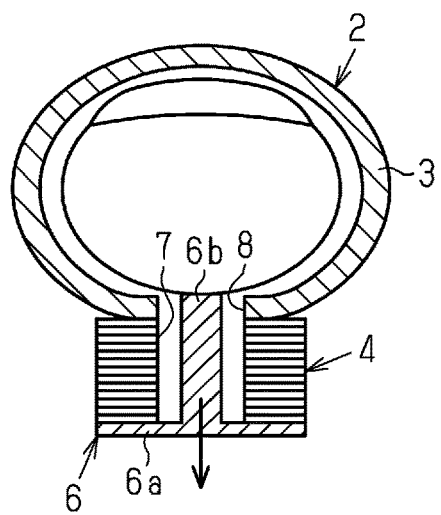

FIGS. 2A and 2B are cross-sectional views of the glove 2 taken along arrow A-A shown in FIG. 1. As understood from FIGS. 2A and 2B, the haptic stimulator 6 includes a flat portion 6a and a shaft 6b projecting from the flat portion 6a. The flat portion 6a is supported by the polymer actuator 4 on a surface of the base fabric 3 of the glove 2 opposite to the surface that is in contact with the skin. The shaft 6b projects from the flat portion 6a toward the base fabric 3. The polymer actuator 4 is located between the base fabric 3 and the flat portion 6a of the haptic stimulator 6 and fixed to the base fabric 3 and the flat portion 6a. The polymer actuator 4 and the base fabric 3 respectively include a hole 7 and a hole 8, which are in communication with each other. The shaft 6b of the haptic stimulator 6 extends through the hole 7 and the hole 8 so as to be in contact with the skin of the hand of the user. The haptic stimulator 6 including the shaft 6b serves as a contact portion to the skin.

Figure 3:
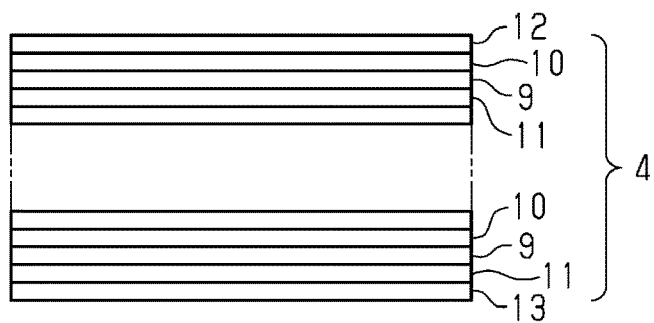
FIG. 3 is a side schematic view showing dielectric elastomer layers and first and second conductive rubber layers of the polymer actuator.

As schematically shown in FIG. 3, the polymer actuator 4 includes multiple dielectric elastomer layers 9 and first and second conductive rubber layers 10 and 11 arranged on opposite surfaces of each dielectric elastomer layer 9 to serve as positive and negative electrodes. The polymer actuator 4 includes a protective layer 12 on the uppermost side in FIG. 3 to cover the first conductive rubber layer 10, and a protective layer 13 on the lowermost side in FIG. 3 to cover the second conductive rubber layer 11.

The polymer actuator 4 used in this embodiment has three actuator units each having a thickness of about 7 mm laminated to have a total thickness of about 21 mm. Each actuator unit includes one hundred dielectric elastomer layers 9. Each dielectric elastomer layer 9 and the protective layers 12 and 13 are made of a crosslinked polyrotaxane with the thickness of about 50 μm. The first conductive rubber layer 10 and the second conductive rubber layer 11 are made of a conductive silicone elastomer with the thickness of about 20 μm.

Applying positive voltage and negative voltage to the first conductive rubber layer 10 and the second conductive rubber layer 11 causes the dielectric elastomer layer 9 to be compressed and deformed by the conductive rubber layers 10 and 11. This contracts the polymer actuator 4 in the laminating direction as shown in FIG. 2A. Suspending the application of the voltage restores the dielectric elastomer layer 9. This returns the polymer actuator 4 to the original thickness as shown in FIG. 2B. When this series of actions are cyclically performed, the skin vibrates through the shaft b.

The application of voltage to the polymer actuator 4 is executed by the controller 5, which is shown in FIG. 1. The controller 5 includes a memory 5a. The memory 5a includes the data of rectangular waves in which the change in the magnitude of applied voltage is represented versus time. The controller 5 uses this data to statically or cyclically apply voltage to the first conductive rubber layers 10 and the second conductive rubber layers 11. The controller 5 of this embodiment is capable of outputting a rectangular wave having at least up to 1200 V over at least a range of 1 Hz to 100 Hz.

When the haptic stimulator 6 (shaft 6b) is driven by the polymer actuator 4 to physically stimulate the skin, skin sensory receptors (reception cells) give a simulated tactile sensation, with which the user feels something touching him/her, or a simulated pressure sensation, with which the user feels something pressed against him/her. At this time, the tactile sensation presented to the skin of the hand of the user corresponds to the above-described rectangular wave data stored in the memory 5a of the controller 5. Thus, rewriting the wave data stored in the memory 5a of the controller 5 allows the tactile presentation device 1 to change the tactile sensation presented to the skin of the hand of the user.

Instead of the data of the rectangular wave, the memory 5a may include the data of an amount of movement of the shaft 6b as a time-based change amount. In this case, the voltage used to obtain the movement amount of the shaft 6b corresponding to the data is consecutively calculated, and the calculated voltage may be applied to the first conductive rubber layer 10 and the second conductive rubber layer 11.

Figure 4:
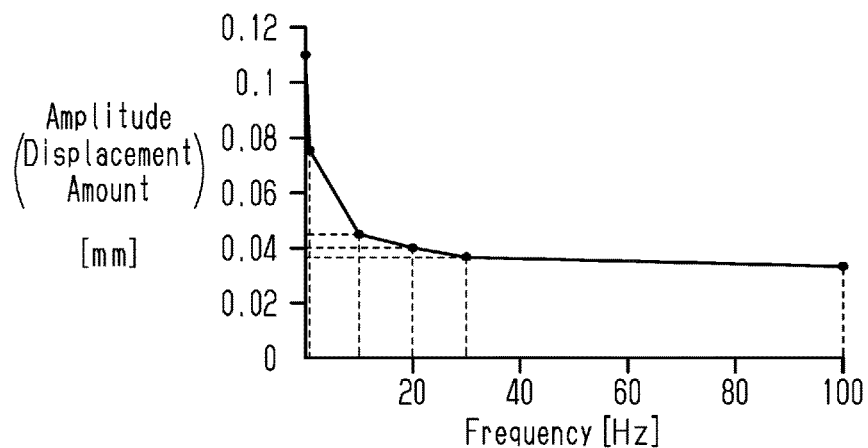
FIG. 4 is a graph showing changes in the amplitudes (displacement amounts) of the dielectric elastomer layers relative to changes in a frequency of voltage applied to the first and the second conductive rubber layers.
Figure 5:
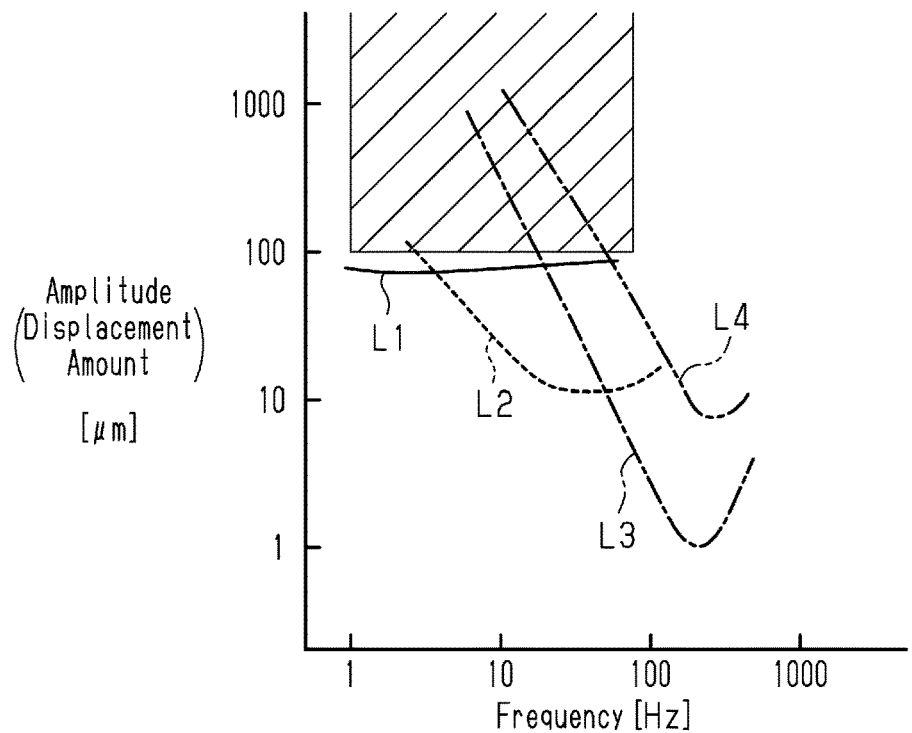
FIG. 5 is a graph showing changes in the minimum values of the amplitudes (displacement amounts) of the vibration relative to changes in the frequency of the vibration at which Merkel cell, Meissner's corpuscle, Ruffini ending, and Pacinian corpuscle may react.

FIG. 4 shows plotted displacement amounts (amplitudes) when rectangular waves with 1200 V are applied to the actuator unit including one hundred dielectric elastomer layers 9 used in this embodiment at the frequencies of 0.1 Hz, 1 Hz, 10 Hz, 20 Hz, 30 Hz, and 100 Hz. In this embodiment, the polymer actuator 4 formed by laminating three actuator units of this type is used. Thus, with a thickness of as little as about 21 mm, the amplitude of 100 μm or greater can be applied to the shaft 6b in contact with the skin using the applied voltage of up to 1200 V from 0.1 Hz to 100 Hz. Accordingly, in this embodiment, the vibration of the shaft 6b can be presented as a tactile sensation through Merkel cells and Meissner's corpuscles.

In addition, the polymer actuator 4 is small and lightweight. This reduces the tactile presentation device 1 in size and weight. This also limits the influence of the weight of the polymer actuator 4 on the vibration of the haptic stimulator 6.

The embodiment described above has the following advantages.

(1) The haptic stimulator 6, which is driven by the polymer actuator 4, vibrates with the amplitude of 100 μm or greater at 0.1 Hz to 100 Hz and the vibration of the haptic stimulator 6 is applied to the skin as a physical stimulus. Such a vibration of the haptic stimulator 6 is the vibration to which Merkel cell and Meissner's corpuscle in the skin may react (the vibration in the shaded area shown in FIG. 5). Thus, the physical stimulus to which Merkel cells and Meissner's corpuscles in the skin may react can be applied to them using the tactile presentation device 1.

(2) The polymer actuator 4 expands and contracts each dielectric elastomer layer 9 in the thickness direction (i.e., the direction orthogonal to the skin) through the application of voltage to the first conductive rubber layer 10 and the second conductive rubber layer 11 on the opposite surfaces of the dielectric elastomer layer 9. The expansion and contraction displace the haptic stimulator 6 in the direction orthogonal to the skin of the hand of the user. In this case, the haptic stimulator 6 driven by the polymer actuator 4 is displaced in the direction orthogonal to the skin. Thus, the vibration (displacement) of the haptic stimulator 6 through the driving of the polymer actuator 4 can be easily applied to the skin as a physical stimulus.

(3) The polymer actuator 4 includes the dielectric elastomer layers 9 and the first and second conductive rubber layers 10 and 11, which are arranged on the opposite surfaces of each dielectric elastomer layer 9. The first conductive rubber layer 10 and the second conductive rubber layer 11 are alternately laminated in the thickness direction with the dielectric elastomer layer 9 located in between. The polymer actuator 4 expands and contracts the dielectric elastomer layers 9 in the thickness direction through the application of voltage to the first conductive rubber layer 10 and the second conductive rubber layer 11. In this case, the dielectric elastomer layer 9 and the first and second conductive rubber layers 10 and 11 can be formed to be thin. Accordingly, even if two or more sets of the dielectric elastomer layer 9 and the first and second conductive rubber layers 10 and 11 are laminated in the thickness direction, the polymer actuator 4 will not be too large. This allows a user to wear and use the tactile presentation device 1.

The above-described embodiment may be modified as follows.

The tactile presentation device 1 does not have to be of a glove type worn on the hand of a user. Instead, the tactile presentation device 1 may be, for example, of a bar type gripped by a user with the hand or of an installation type arranged on a fixed base on which a user puts the hand.

The tactile presentation device 1 may be coupled to, for example, the handle of a vehicle. In this case, the presentation of a tactile sensation to the skin of the hand of a user by the tactile presentation device 1 can be used for warning or notification to the user.

The value of voltage that can be applied to the polymer actuator 4 by the controller 5 is not limited to at least 1200 V and may be changed.

The thicknesses of the dielectric elastomer layer 9 and the first and second conductive rubber layers 10 and 11 in the polymer actuator 4 may be changed. In this case, the length of the polymer actuator 4 in the thickness direction is preferably 5 cm or less and is more preferably 3 cm or less.

In addition to the polymer actuator 4, an eccentric motor or the like that drives the haptic stimulator 6 may be provided to drive (vibrate) the haptic stimulator 6 at a high-frequency of, for example, 100 Hz or higher.

When the action of force of holding an item expands and contracts the dielectric elastomer layer 9 in the thickness direction, the tactile presentation device 1 may be used as a sensor that detects the action of the force based on a change in the capacitance that occurs between the conductive rubber layers 10 and 11.

The invention claimed is:

1. A tactile presentation device comprising:
a contact portion configured to contact a skin;
a polymer actuator that drives the contact portion; and
a controller that applies voltage to the polymer actuator, wherein
the tactile presentation device is configured to present a tactile sensation to the skin by driving the contact portion using the polymer actuator through the application of the voltage to the polymer actuator by the controller, and
the polymer actuator is configured to displace the contact portion by at least 100 μm when a frequency of the voltage to be applied is 1 to 30 Hz.

2. The tactile presentation device according to claim 1, wherein the polymer actuator is configured to displace the contact portion by at least 100 μm when the frequency of the voltage to be applied is 1 to 100 Hz.

3. The tactile presentation device according to claim 1, wherein the controller is applying, to the polymer actuator, voltage of at least 1200 V at the frequency of 1 to 30 Hz.

4. The tactile presentation device according to claim 1, wherein the polymer actuator expands and contracts in a direction orthogonal to the skin to drive the contact portion so as to displace the contact portion in the direction orthogonal to the skin.

5. The tactile presentation device according to claim 1, wherein
the polymer actuator includes a laminate of a dielectric elastomer layer and conductive rubber layers, the conductive rubber layers being arranged on opposite surfaces of the dielectric elastomer layer such that the dielectric elastomer layer and the conductive rubber layers are positioned in an alternating manner in a thickness direction, and
the polymer actuator is configured to expand and contract the dielectric elastomer layer in the thickness direction through the application of the voltage to the conductive rubber layers.

6. The tactile presentation device according to claim 5, wherein a length of the polymer actuator in the thickness direction is 5 cm or less.

7. The tactile presentation device according to claim 6, wherein the length of the polymer actuator in the thickness direction is 3 cm or less.

8. The tactile presentation device according to claim 5, wherein
the dielectric elastomer layer is made of a crosslinked polyrotaxane.

9. The tactile presentation device according to claim 5, further comprising a flexible base material attachable to a human body so as to be in contact with the skin, wherein
the contact portion is supported by the polymer actuator on a surface of the base material opposite to a surface of the base material that is in contact with the skin,
the base material includes a hole, and
the contact portion includes a shaft extending through the hole of the base material so that the shaft contacts the skin.

10. The tactile presentation device according to claim 9, wherein
the polymer actuator includes a hole communicating with the hole of the base material, and
the shaft of the contact portion extends through the hole of the base material and the hole of the polymer actuator.

* * * * *